(12) United States Patent
Peng et al.

(10) Patent No.: US 9,158,425 B2
(45) Date of Patent: Oct. 13, 2015

(54) TOUCH PANEL AND TOUCH DISPLAY PANEL

(71) Applicant: Au Optronics Corporation, Hsinchu (TW)

(72) Inventors: Yan-Yu Peng, New Taipei (TW); Yu-Feng Chien, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 235 days.

(21) Appl. No.: 13/868,098

(22) Filed: Apr. 22, 2013

(65) Prior Publication Data

US 2014/0078100 A1    Mar. 20, 2014

(30) Foreign Application Priority Data

Sep. 17, 2012    (TW) .............................. 101134025 A

(51) Int. Cl.
*G06F 3/045*    (2006.01)
*G01R 27/00*    (2006.01)
*G06F 3/041*    (2006.01)

(52) U.S. Cl.
CPC ................ *G06F 3/045* (2013.01); *G01R 27/00* (2013.01); *G06F 3/041* (2013.01)

(58) Field of Classification Search
CPC .................................. G06F 3/045; G06F 3/041
USPC ...................... 345/173–175; 178/18.01–18.03
See application file for complete search history.

(56) References Cited

U.S. PATENT DOCUMENTS

| 6,824,935 | B2 | 11/2004 | Tanaka et al. |
| 7,440,118 | B2 | 10/2008 | Uda et al. |
| 2003/0138574 | A1 | 7/2003 | Tanaka et al. |
| 2004/0248383 | A1* | 12/2004 | Weng et al. .................... 438/462 |
| 2009/0109186 | A1* | 4/2009 | Pan et al. ........................ 345/173 |
| 2009/0223722 | A1* | 9/2009 | Yang ........................... 178/18.01 |
| 2010/0302206 | A1* | 12/2010 | Yu et al. ......................... 345/174 |
| 2010/0316790 | A1* | 12/2010 | Li .................................... 427/68 |
| 2011/0285641 | A1* | 11/2011 | Huang .......................... 345/173 |
| 2012/0050654 | A1 | 3/2012 | Kim et al. |
| 2013/0300677 | A1* | 11/2013 | Kim et al. ..................... 345/173 |

FOREIGN PATENT DOCUMENTS

| CN | 1410814 | 4/2003 |
| CN | 101424811 | 5/2009 |

(Continued)

OTHER PUBLICATIONS

"Office Action of Taiwan Counterpart Application", issued on Jul. 16, 2014, p. 1-p. 9.

*Primary Examiner* — Pegeman Karimi
(74) *Attorney, Agent, or Firm* — Jianq Chyun IP Office

(57) ABSTRACT

A touch panel includes a substrate, a touch device layer, a sensing circuit structure, and a planarization layer. The substrate includes a sensing region and a peripheral region that surrounds the sensing region. The touch device layer is disposed on the sensing region of the substrate. The sensing circuit structure is disposed on the peripheral region of the substrate, and the sensing circuit structure includes a plurality of sensing lines. The sensing lines are electrically connected to the touch device layer. The planarization layer is located on the substrate. Here, the planarization layer includes a color-resist material that has a dielectric coefficient ranging from about 3 to about 5, and the planarization layer covers the sensing lines located in the peripheral region.

12 Claims, 3 Drawing Sheets

(56) References Cited

FOREIGN PATENT DOCUMENTS

| CN | 101441347 | 5/2009 |
| CN | 202217245 U | 5/2012 |
| TW | 200525190 | 8/2005 |
| TW | I349142 | 9/2011 |

\* cited by examiner

TOUCH PANEL AND TOUCH DISPLAY PANEL

CROSS-REFERENCE TO RELATED APPLICATION

This application claims the priority benefit of Taiwan Application Serial Number 101134025, filed on Sep. 17, 2012. The entirety of the above-mentioned patent application is hereby incorporated by reference herein and made a part of this specification.

BACKGROUND OF THE INVENTION

1. Field of the Invention

The invention relates to a panel, more particularly, relates to a touch panel and a touch display panel.

2. Description of Related Art

Based on different ways of sensing, touch panels are generally categorized into resistant touch panels, capacitive touch panels, optical touch panels, sonic wave touch panels, and electromagnetic touch panels. The configurations of touch panels and display panels may further classify the touch panels into an add-on type and an in-cell type. Touch devices are often formed on a substrate to make the touch panel, and the touch panel is then attached to an outer surface of a display panel. This is the so-called add-on type touch panel. By contrast, the in-cell touch panel is formed by directly integrating the touch devices into the display panel.

In the existing in-cell touch panel structure, fan-out lines extending from a sensing region to a peripheral region may result in the peripheral region with an uneven surface. To solve this problem, an overcoat layer is often formed on the color filter side, such that sealant may be distributed on a relatively even surface. Thereby, if a pixel array substrate and a color filter substrate are assembled, an around-gap-mura problem caused by the uneven surface of a visible region may not occur.

Nonetheless, the overcoat layer is usually made of an organic material that is apt to absorb moisture; therefore, in an assembly process or the like manufacturing process, moisture may be released due to heat. As such, the moisture-containing liquid crystal layer may result in the around-gap-mura problem in the panel.

SUMMARY OF THE INVENTION

The invention is directed to a touch panel which is rather reliable and cost-effective.

The invention is also directed to a touch display panel characterized by reliability, favorable display quality, and low manufacturing costs.

In an embodiment of the invention, a touch panel that includes a substrate, a touch device layer, a sensing circuit structure, and a planarization layer is provided. The substrate has a sensing region and a peripheral region that surrounds the sensing region. The touch device layer is disposed on the sensing region of the substrate. The sensing circuit structure is disposed on the peripheral region of the substrate, and the sensing circuit structure includes a plurality of sensing lines. The sensing lines are electrically connected to the touch device layer. The planarization layer is located on the substrate. Here, the planarization layer includes a color-resist material that has a dielectric coefficient ranging from about 3 to about 5, and the planarization layer covers the sensing lines located in the peripheral region.

In an embodiment of the invention, a touch display panel that includes a first substrate, a second substrate, a touch device layer, a sensing circuit structure, a planarization layer, and a display medium is provided. The second substrate is disposed opposite to the first substrate and has a surface that faces the first substrate. Here, the surface has a sensing region and a peripheral region surrounding the sensing region. The touch device layer is disposed on the surface of the second substrate and located in the sensing region. The sensing circuit structure is disposed on the surface of the second substrate and located in the peripheral region. Here, the sensing circuit structure includes a plurality of sensing lines, and the sensing lines are electrically connected to the touch device layer. The planarization layer is disposed on the surface of the second substrate. Here, the planarization layer includes a color-resist material with a dielectric coefficient ranging from about 3 to about 5, and the planarization layer covers the sensing lines located in the peripheral region. The display medium is disposed between the first substrate and the second substrate.

In the aforesaid touch panel and the aforesaid touch display panel, the planarization layer is made of the color-resist material with the dielectric coefficient ranging from 3 to 5, such that the planarization layer may be characterized by water resistance, gas resistance, and insulation. As such, the touch panel and the touch display panel described herein may have reliability, long life, and low manufacturing costs.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1A:
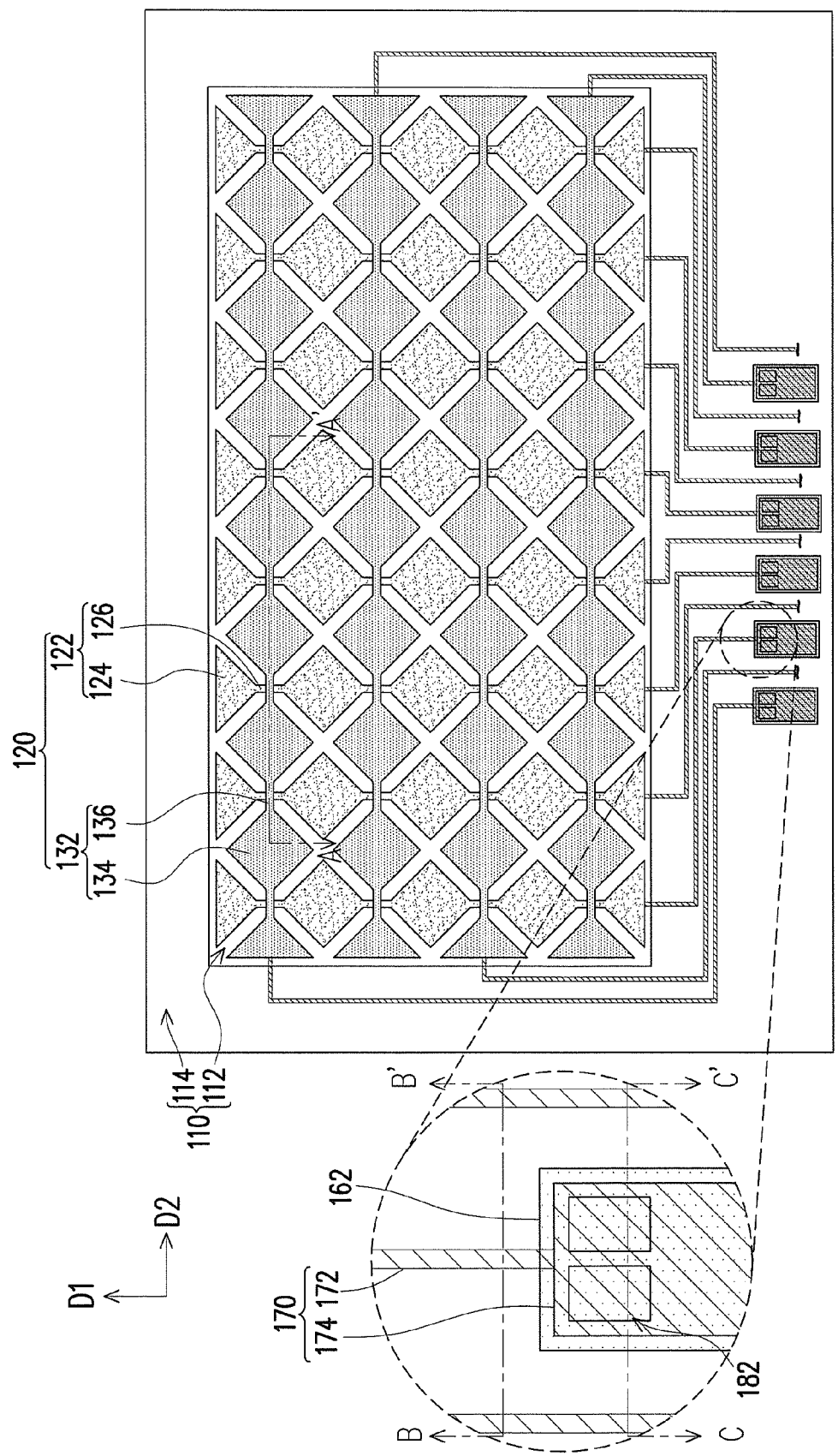
FIG. 1A is a schematic top view illustrating a touch panel according to an embodiment of the invention.
Figure 1B:
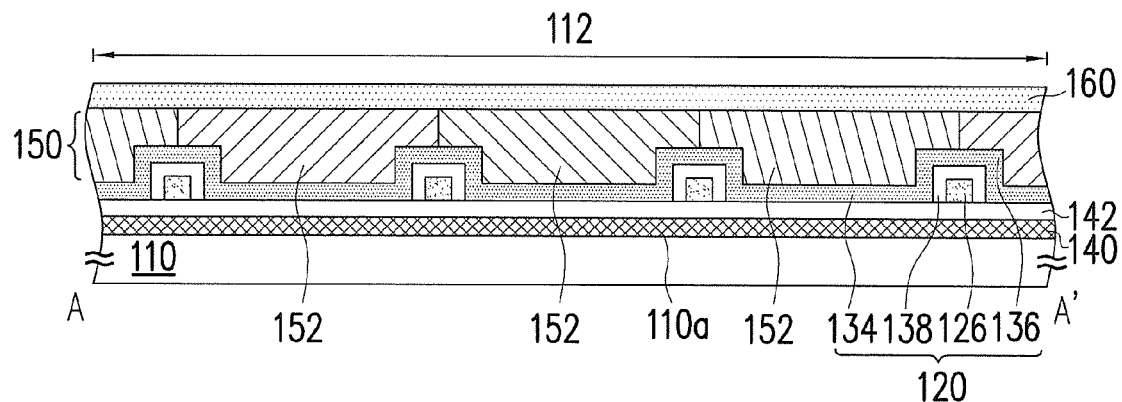
FIG. 1B is a schematic cross-sectional view taken along a line A-A' depicted in FIG. 1A.
Figure 1C:
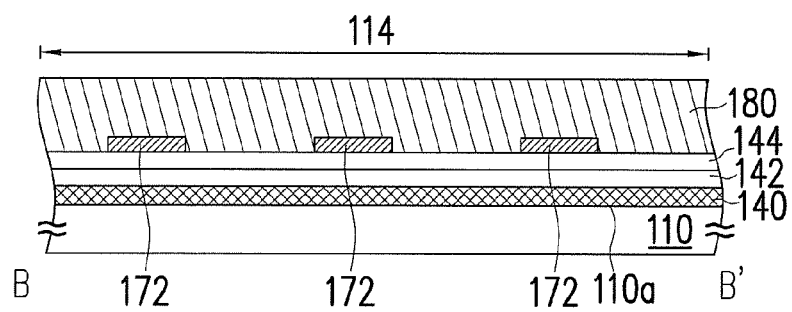
FIG. 1C is a schematic cross-sectional view taken along a line B-B' depicted in FIG. 1A.
Figure 1D:
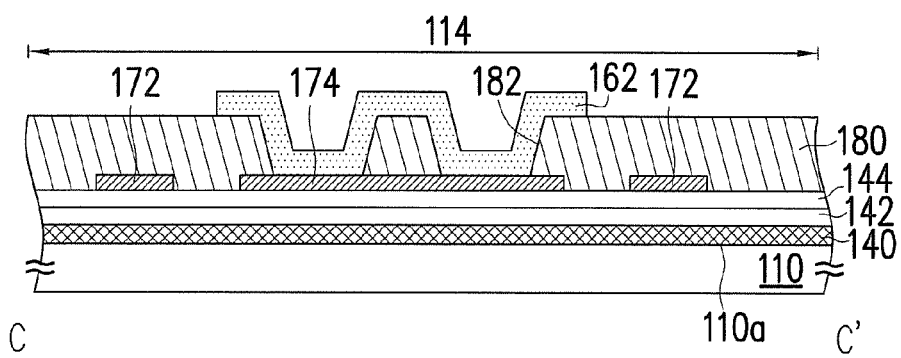
FIG. 1D is a schematic cross-sectional view taken along a line C-C' depicted in FIG. 1A.

FIG. 1A is a schematic top view illustrating a touch panel according to an embodiment of the invention, and FIGS. 1B, 1C, and 1D are schematic cross-sectional views respectively taken along a line A-A', a line B-B', and a line C-C' depicted in FIG. 1A. With reference to FIG. 1A to FIG. 1D, a touch panel 100 includes a substrate 110, a touch device layer 120, a sensing circuit structure 170, and a planarization layer 180. The substrate 110 has a surface 110a and has a sensing region 112 and a peripheral region 114 that surrounds the sensing region 112. Here, the substrate 110 is a glass substrate, a plastic substrate, a flexible substrate, or any other suitable substrate.

The touch device layer 120 is disposed on the sensing region 112 of the substrate 110. In the present embodiment, the touch device layer 120 is disposed on the surface 110a of the substrate 110. The touch device layer 120, for instance, includes a plurality of first sensing series 122 and a plurality of second sensing series 132. The first sensing series 122 are disposed on the substrate 110, extend along a first direction D1, and are parallel to one another, for instance. Besides, each of the first sensing series 122 includes a plurality of first sensing pads 124 and a plurality of first bridge lines 126, for instance. Each of the first bridge lines 126 connects two adjacent first sensing pads 124. According to the present embodiment, the first sensing pads 124 and the first bridge lines 126 are made of the same material, for instance, and the first sensing pads 124 and the first bridge lines 126 are integrally formed, for instance.

The second sensing series 132 are disposed on the substrate 110, extend along a second direction D2, and are parallel to one another, for instance. Besides, each of the second sensing series 132 includes a plurality of second sensing pads 134 and a plurality of second bridge lines 136, for instance. Each of the second bridge lines 136 connects two adjacent second sensing pads 134. Note that the first direction D1 is different from the second direction D2. In the present embodiment, the first direction D1 is perpendicular to the second direction D2, the first direction D1 is the y direction, and the second direction D2 is the x direction, for instance. According to the present embodiment, the second sensing pads 134 and the second bridge lines 136 are made of the same material, for instance, and the second sensing pads 134 and the second bridge lines 136 are integrally formed, for instance. Insulation patterns 138 are, for instance, arranged at the intersections between the first sensing series 122 and the second sensing series 132. Although the touch sensing devices described in the present embodiment have the structure shown in FIG. 1A to FIG. 1D, the invention is not limited thereto, and the touch sensing devices may have other structures or shapes known to people skilled in the art. In addition, the materials and the shapes of the sensing pads and the bridge lines are well known to people skilled in the art, no further explanation is provided hereinafter.

According to the present embodiment, the touch panel 100 further includes a light shielding pattern layer 140 and a filter pattern layer 150. The light shielding pattern layer 140 is disposed on the substrate 110 and located between the substrate 110 and the touch device layer 120. Here, the light shielding pattern layer 140 includes a black matrix, for instance. According to the present embodiment, the touch panel 100 further includes an insulation layer 144 located in the peripheral region 114, for instance. The insulation layer 144 is disposed on the light shielding pattern layer 140, for instance, and the insulation layer 144 are formed together with the insulation patterns 138 in the sensing region 112, for instance. In the present embodiment, a dielectric layer 142 is further disposed between the light shielding pattern layer 140 and the insulation layer 144, for instance. The dielectric layer 142 is made of silicon nitride, for instance. In another embodiment, however, the dielectric layer 142 may be omitted. The filter pattern layer 150 is disposed on the touch device layer 120 and has a plurality of filter patterns 152, for instance. Here, the filter patterns 152 at least include one color-resist material. The filter patterns 152 include a plurality of red filter patterns, a plurality of green filter patterns, and a plurality of blue filter patterns, for instance. The touch panel 100 described herein may further include a common electrode 160 that is disposed on the filter pattern layer 150, for instance. The common electrode 160 is made of indium tin oxide (ITO), for instance. Namely, the touch device layer 120 is integrated into the color filter substrate, so as to form the in-cell type touch panel 100.

The sensing circuit structure 170 is disposed on the peripheral region 114 of the substrate 110, and the sensing circuit structure 170 includes a plurality of sensing lines 172. The sensing lines 172 are electrically connected to the touch device layer 120. In the present embodiment, the sensing lines 172 extend from the sensing region 112 to the peripheral region 114, for instance. The sensing circuit structure 170 described herein may further include pads 174, for instance. The sensing lines 172 and the pads 174 are located on the insulation layer 144, for instance. One end of each sensing line 172 is connected to one of the first sensing series 122 or one of the second sensing series 132, and the other end of each sensing line 172 is connected to the pads 174. Therefore, the touch device layer 120 is electrically connected to the pads 174. According to the present embodiment, the sensing lines 172 and the pads 174 are made of the same material, for instance, and the sensing lines 172 and the pads 174 are integrally formed, for instance. Besides, the sensing lines 172 and the pads 174 are made of the same material as the material of the second sensing pads 134 and the second bridge lines 136, for instance. In an exemplary embodiment, the sensing lines 172, the pads 174, the second sensing pads 134, and the second bridge lines 136 are formed by patterning a conductive layer (not shown).

The planarization layer 180 is located on the substrate 110. Here, the planarization layer 180 includes a color-resist material that has a dielectric coefficient ranging from about 3 to about 5, and the planarization layer 180 covers the sensing lines 172 located in the peripheral region 114. Here, the color-resist material includes but is not limited to resin (e.g., acrylic, polyimide, PVA, or any other appropriate resin), dispersant, solvent, and color ink (e.g., red, green, blue, or a combination thereof), for instance. Since the color-resist material of the planarization layer 180 is the same as the color-resist material of at least one of the filter patterns 152, the planarization layer 180 and the filter patterns 152 may be formed in one manufacturing step. For instance, the material of the planarization layer 180 may be the same as the color-resist material of the red filter patterns, the green filter patterns, the blue filter patterns, or a combination thereof. Besides, the planarization layer 180 is made by conducting a coating method, and the thickness of the planarization layer 180 may be the same as or different from the thickness of the filter patterns 152. Additionally, the planarization layer 180 may have favorable insulation properties because the dielectric coefficient of the color-resist material ranges from about 3 to about 5. Here, the planarization layer 180 further covers the pads 174 and has a plurality of contact windows 182 exposing the pads 174, for instance. Conductive patterns 162 are disposed on the planarization layer 180, and the contact windows 182 are filled with the conductive patterns 162, for instance. Therefore, the conductive patterns 162 are electrically connected to the pads 174 through the contact windows 182 and further electrically connected to the touch device layer 120 through the sensing lines 172. In the present embodiment, the conductive patterns 162 are made of the same material as that of the common electrode 160, and the conductive patterns 162 and the common electrode 160 are formed by patterning the same transparent conductive layer, for instance. The transparent conductive layer is made of ITO, for instance.

According to the present embodiment, the planarization layer 180 is made of the color-resist material with the dielectric coefficient ranging from about 3 to about 5. Since the color-resist material is water resistant, gas resistant, and insulated, the planarization layer described herein may not have the defect of moisture absorption compared to the conventional planarization layer made of an organic material that may absorb moisture. As a result, the resultant touch panel 100 may have reliability and long life. Moreover, since the color-resist material of the planarization layer 180 may be the same as the color-resist material of at least one of the filter patterns 152, the planarization layer 180 and the filter patterns 152 may be formed together, which simplifies the manufacture of the touch panel 100 and reduces manufacturing costs of the touch panel 100.

Figure 2:
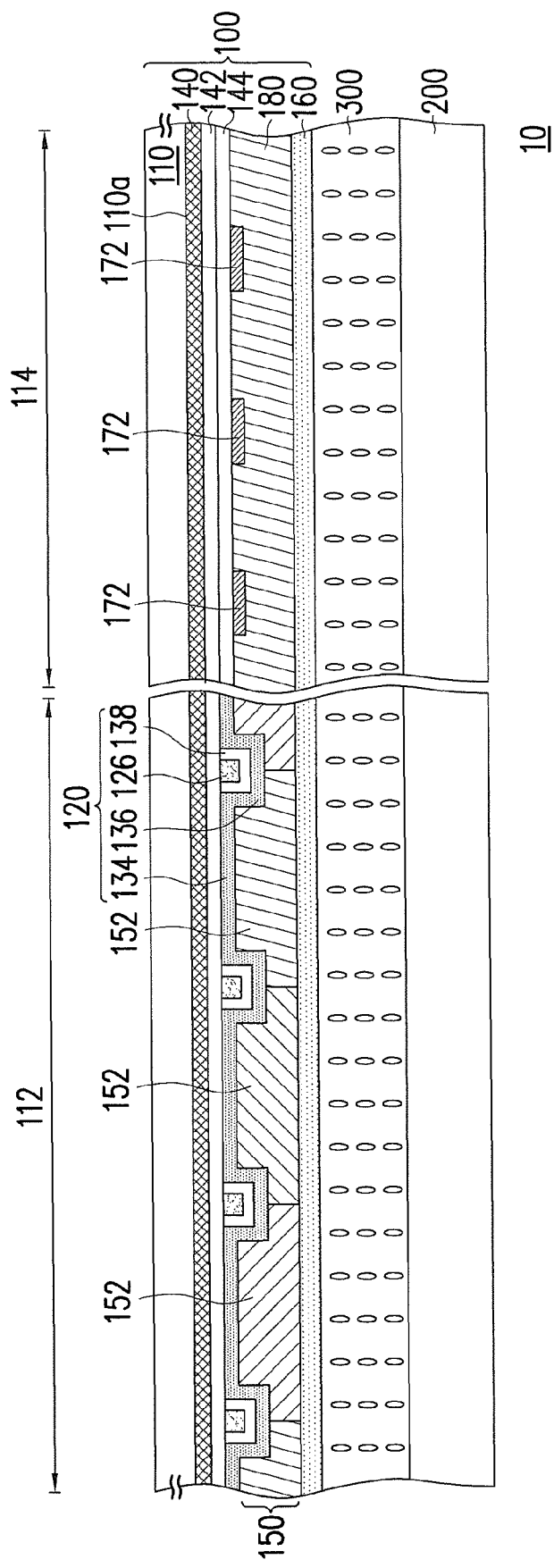
FIG. 2 is a schematic cross-sectional view illustrating a touch display panel according to an embodiment of the invention.

FIG. 2 is a schematic cross-sectional view illustrating a touch display panel according to an embodiment of the invention. With reference to FIG. 2, a touch display panel 10 includes a substrate 200, another substrate 110, a touch device layer 120, a sensing circuit structure 170, a planarization layer 180, and a display medium 300. The structures of the touch device layer 120, the sensing circuit structure 170, and the planarization layer 180 may be referred to as those described in the previous embodiments and depicted in FIG. 1A to FIG. 1D. Hence, no further explanation will be provided hereinafter.

The substrate 200 is, for example, a pixel array substrate. The substrate 110 is located opposite to the substrate 200 and has a surface 110a that faces the substrate 200. Besides, the surface 110a has a sensing region 112 and a peripheral region 114 that surrounds the sensing region 112. The touch device layer 120 is disposed on the surface 110a of the substrate 110 and located in the sensing region 112. The sensing circuit structure 170 is disposed on the surface 110a of the substrate 110 and located in the peripheral region 114, and the sensing circuit structure 170 includes a plurality of sensing lines 172. Here, the sensing lines 172 are electrically connected to the touch device layer 120 and extend from the sensing region 112 to the peripheral region 114. The planarization layer 180 is located on the surface 110a of the substrate 110 and includes a color-resist material that has a dielectric coefficient ranging from about 3 to about 5, and the planarization layer 180 covers the sensing lines 172 located in the peripheral region 114. The display medium 300 is disposed between the substrate 200 and the substrate 110. Here, the display medium 300 is a liquid crystal layer, for instance. According to the present embodiment, the touch panel 100 is assembled to the substrate 200, so as to form the touch display panel 10, for instance. Here, the peripheral region 114 (i.e., the peripheral region 114 shown in FIG. 1C and FIG. 1D) corresponds to a sealant region, for instance. That is, a sealant (not shown) is formed on the planarization layer 180 in the peripheral region 114 for bonding the touch panel 100 to the substrate 200, for instance. Therefore, the touch display panel 10 may be formed.

According to the present embodiment, the planarization layer 180 is made of the color-resist material with the dielectric coefficient ranging from about 3 to about 5. Since the color-resist material is water resistant, gas resistant, and insulated, the planarization layer described herein may not have the defect of moisture absorption (the conventional planarization layer made of an organic material may absorb moisture). When the substrate 200 and the touch panel 100 are assembled to each other, or when any other heating process is performed, the heated planarization layer 180 may be prevented from releasing moisture to the display medium 300. As such, the touch display panel 10 may have reliability, long life, and favorable display frames. Moreover, the planarization layer 180 may have the peripheral region 114 with the even surface, and thus the sealant may be formed on the even surface, which is conducive to the assembly process. Further, the resultant touch display panel 10 may have satisfactory display quality. In another aspect, since the color-resist material of the planarization layer 180 may be the same as the color-resist material of at least one of the filter patterns 152, the planarization layer 180 and the filter patterns 152 may be formed together, which simplifies the manufacture of the touch display panel 10 and reduces manufacturing costs of the touch display panel 10.

To sum up, in the touch panel and the touch display panel described herein, the planarization layer is made of the color-resist material with the dielectric coefficient ranging from about 3 to about 5, such that the planarization layer is water resistant, gas resistant, and insulated. As a result, the resultant touch panel has good reliability and long life. In addition, when the substrate and the touch panel are assembled to each other, or when any other heating process is performed, the heated planarization layer may be prevented from releasing moisture to the display medium. As such, the touch display panel has good reliability, long life, and favorable display frames.

From another perspective, the planarization layer may have the peripheral region with the even surface, and thus the sealant may be formed on the even surface, which is conducive to the assembly process. Further, the resultant touch display panel may have satisfactory display quality. Moreover, since the color-resist material of the planarization layer may be the same as the color-resist material of at least one of the filter patterns, the planarization layer and the filter patterns may be formed together, which simplifies the manufacture of the touch panel and the touch display panel and reduces manufacturing costs of the touch panel and the touch display panel.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A touch panel comprising:
   a substrate having a sensing region and a peripheral region surrounding the sensing region;
   a touch device layer disposed on the sensing region of the substrate;
   a sensing circuit structure disposed on the peripheral region of the substrate, wherein the sensing circuit structure includes a plurality of sensing lines electrically connected to the touch device layer; and
   a planarization layer located on the substrate, wherein the planarization layer includes a color-resist material with a dielectric coefficient ranging from about 3 to about 5, and the planarization layer covers the sensing lines located in the peripheral region.

2. The touch panel as recited in claim 1, wherein the color-resist material comprises a red filter material, a green filter material, a blue filter material, or a combination thereof.

3. The touch panel as recited in claim 1, further comprising:
   a filter pattern layer disposed on the touch device layer, wherein the filter pattern layer includes a plurality of filter patterns, and one of the filter patterns includes the color-resist material; and
   a common electrode disposed on the filter pattern layer.

4. The touch panel as recited in claim 3, wherein the filter patterns comprise a plurality of red filter patterns, a plurality of green filter patterns, and a plurality of blue filter patterns.

5. The touch panel as recited in claim 1, further comprising a light shielding pattern layer disposed on the substrate and located between the substrate and the touch device layer.

6. The touch panel as recited in claim 1, wherein the sensing lines extend from the sensing region to the peripheral region.

7. A touch display panel comprising:
   a first substrate;
   a second substrate disposed opposite to the first substrate, wherein the second substrate has a surface facing the first substrate and the surface has a sensing region and a peripheral region surrounding the sensing region;
   a touch device layer disposed on the surface of the second substrate and located in the sensing region;
   a sensing circuit structure disposed on the surface of the second substrate and located in the peripheral region, wherein the sensing circuit structure includes a plurality of sensing lines electrically connected to the touch device layer;
   a planarization layer disposed on the surface of the second substrate, wherein the planarization layer includes a color-resist material with a dielectric coefficient ranging from about 3 to about 5, and the planarization layer covers the sensing lines located in the peripheral region; and
   a display medium disposed between the first substrate and the second substrate.

8. The touch display panel as recited in claim 7, wherein the color-resist material comprises a red filter material, a green filter material, a blue filter material, or a combination thereof.

9. The touch display panel as recited in claim 7, further comprising:
   a filter pattern layer disposed on the touch device layer, wherein the filter pattern layer includes a plurality of filter patterns, and one of the filter patterns includes the color-resist material; and
   a common electrode disposed on the filter pattern layer.

10. The touch display panel as recited in claim 9, wherein the filter patterns comprise a plurality of red filter patterns, a plurality of green filter patterns, and a plurality of blue filter patterns.

11. The touch display panel as recited in claim 7, further comprising a light shielding pattern layer disposed on the second substrate and located between the second substrate and the touch device layer.

12. The touch display panel as recited in claim 7, wherein the sensing lines extend from the sensing region to the peripheral region.

* * * * *